(12) United States Patent
Tomida

(10) Patent No.: US 8,614,474 B2
(45) Date of Patent: Dec. 24, 2013

(54) THIN FILM TRANSISTOR MEMORY AND DISPLAY UNIT INCLUDING THE SAME

(75) Inventor: Masahiro Tomida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/807,316

(22) PCT Filed: May 11, 2011

(86) PCT No.: PCT/JP2011/002623
§ 371 (c)(1),
(2), (4) Date: Dec. 28, 2012

(87) PCT Pub. No.: WO2012/004920
PCT Pub. Date: Jan. 12, 2012

(65) Prior Publication Data
US 2013/0105794 A1    May 2, 2013

(30) Foreign Application Priority Data

Jul. 5, 2010    (JP) ................... 2010-153263

(51) Int. Cl.
*H01L 29/786*    (2006.01)
(52) U.S. Cl.
USPC ............... 257/314; 257/59; 257/72; 257/315; 257/E29.129; 257/E51.005; 257/E51.006; 438/257
(58) Field of Classification Search
USPC ............ 257/59, 72, 314, 315, E29.129, 257/E51.005, E51.006; 438/257
See application file for complete search history.

(56) References Cited

U.S. PATENT DOCUMENTS

| | | | |
|---|---|---|---|
| 5,060,034 | A | 10/1991 | Shimizu et al. |
| 2001/0038555 | A1 | 11/2001 | Kato |
| 2009/0045397 | A1 | 2/2009 | Iwasaki |
| 2010/0084650 | A1 | 4/2010 | Yamazaki et al. |

FOREIGN PATENT DOCUMENTS

| | | |
|---|---|---|
| JP | 55-000530 A | 1/1980 |
| JP | 02-122673 A | 5/1990 |
| JP | 02-159768 A | 6/1990 |
| JP | 02-297973 A | 12/1990 |
| JP | 04-025181 A | 1/1992 |
| JP | 2002-043447 A | 2/2002 |
| JP | 2007-103918 A | 4/2007 |
| JP | 2009-260069 A | 11/2009 |
| JP | 2010-109357 A | 5/2010 |
| JP | 2010-219455 A | 9/2010 |
| WO | 2010/131310 A1 | 11/2010 |

OTHER PUBLICATIONS

Official Communication issued in International Patent Application No. PCT/JP2011/002623, mailed on Aug. 16, 2011.

*Primary Examiner* — Kenneth Parker
*Assistant Examiner* — John Lin
(74) *Attorney, Agent, or Firm* — Keating & Bennett, LLP

(57) ABSTRACT

The area C1 of the channel region of the drive TFT and the area C2 of the channel region of the memory TFT are set to have a relationship C1<C2 to an extent that allows predetermined hysteresis natures dependent on respective functions thereof.

4 Claims, 7 Drawing Sheets

(a) WRITE (b) ERASE (c) READ (a)

(b)

(c)

(d)

THIN FILM TRANSISTOR MEMORY AND DISPLAY UNIT INCLUDING THE SAME

TECHNICAL FIELD

The present disclosure relates to thin film transistor memories and display units including the same.

BACKGROUND ART

Conventionally, a thin film transistor (hereinafter referred to as TFT) memory including a memory TFT for storing data and a drive TFT for selectively driving the memory TFT is known as a non-volatile memory, such as an electrically erasable and programmable read only memory (EEPROM).

Examples of such a TFT memory include a TFT memory which employs a technique using an insulating film having a trapping level. In such a TFT memory employing this technique using such an insulating film, the drive TFT and the memory TFT each employ, for example, a bottom gate structure, and each include a gate electrode formed on an insulating substrate such as a glass substrate, a gate insulating film formed so as to cover the gate electrode, a semiconductor layer formed of amorphous silicon (a-Si) etc. formed on the gate insulating film so as to overlap with the gate electrode, and a source electrode and a drain electrode, spaced apart from each other, coupled to the semiconductor layer.

The memory TFT described above provides a memory function utilizing hysteresis phenomena (hysteretic phenomena), which occur from charge accumulation caused by electrical trap in the vicinity of the boundary with the semiconductor layer in the gate insulating film. Therefore, the memory TFT needs to have a sufficiently high hysteresis nature. As such, a gate insulating film having a large number of trapping levels, and accordingly having a high capability of charge accumulation, is preferably used as a gate insulating film of a memory TFT.

On the contrary, a wide variation in the threshold voltage will prevent the drive TFT described above from performing correct selective driving of the memory TFT. Therefore, the drive TFT needs to have a low hysteresis nature. As such, a gate insulating film having only a small number of trapping levels, and accordingly having a low capability of charge accumulation, is preferably used as a gate insulating film of a drive TFT.

This condition requires the memory TFT and the drive TFT to be formed in separate steps, thereby requiring numerous steps to be performed in order to form a TFT memory.

In this regard, one well known TFT memory is such that, in order to simplify the steps of forming the TFT memory described above, a common gate insulating film is used for the drive TFT and the memory TFT, and a process is performed to change the film properties of either the drive TFT region or the memory TFT region in the gate insulating film so as to partially adjust the capability of charge accumulation of the gate insulating film.

For example, the TFT memory disclosed in Patent Document 1 uses a gate insulating film formed of silicon nitride (SiN) having the capability of charge accumulation (hysteresis nature), and the capability of charge accumulation in the regions other than the memory TFT region in the gate insulating film is disabled by a nitridation or oxidation process.

The TFT memory disclosed in Patent Document 2 uses a gate insulating film formed of silicon nitride (SiN) having no capability of charge accumulation (hysteresis nature), and the memory TFT region of the gate insulating film is provided with the capability of charge accumulation by implantation of silicon (Si) ion.

The TFT memory disclosed in Patent Document 3 uses a gate insulating film formed of silicon nitride (SiN) having the capability of charge accumulation (hysteresis nature), and a silicon nitride film having no capability of charge accumulation is formed between the gate electrode and the gate insulating film of the drive TFT.

In addition, the TFT memory disclosed in Patent Document 4 uses a gate insulating film, at least a surface layer of which is formed of silicon nitride (SiN) having the capability of charge accumulation, and n-type impurity is diffused into the channel region of the drive TFT. Thus, the bandgap difference between the semiconductor layer and the gate insulating film is increased, thereby cancelling the effects of charge injection between the semiconductor layer and the gate insulating film. Accordingly, the hysteresis nature of the drive TFT is lost.

CITATION LIST

Patent Document

PATENT DOCUMENT 1: Japanese Patent Publication No. H02-122673

PATENT DOCUMENT 2: Japanese Patent Publication No. H02-159768

PATENT DOCUMENT 3: Japanese Patent Publication No. H02-297973

PATENT DOCUMENT 4: Japanese Patent Publication No. H04-025181

SUMMARY OF THE INVENTION

Technical Problem

However, formation of the TFT memories disclosed in Patent Documents 1 to 3 each requires a step for adjusting the capability of charge accumulation in the drive TFT region or in the memory TFT region of the gate insulating film.

More specifically, the TFT memory of Patent Document 1 requires a step for nitridizing or oxidizing the drive TFT region of the gate insulating film. The TFT memory of Patent Document 2 requires a step for implanting ions into the memory TFT region of the gate insulating film. The TFT memory of Patent Document 3 requires a step for forming a silicon nitride film having no capability of charge accumulation as a component of the drive TFT separately from the gate insulating film common to the memory TFT and the drive TFT.

Also, the TFT memory of Patent Document 4 requires a step for diffusing n-type impurity into the semiconductor layer of the drive TFT.

As described above, the TFT memories disclosed in Patent Documents 1 to 4 each require a step for adjusting the hysteresis nature of the memory TFT or the drive TFT in the gate insulating film or in the semiconductor layer separately from the step for forming the gate insulating film or the semiconductor layer. Thus, formation of TFT memories still requires a large number of steps, and therefore room for improvement remains.

The present invention has been made in view of the foregoing. It is an object of the present disclosure to reduce the number of steps needed for forming a TFT memory, while reducing the hysteresis nature of the drive TFT to an acceptable level, and at the same time, ensuring a sufficient hysteresis nature for the memory TFT.

Solution to the Problem

In order to achieve the above object, the present invention improves the configuration of the TFT memory so that both the drive TFT and the memory TFT can be adjusted to have predetermined hysteresis natures without performing a step for adjusting the capability of charge accumulation on the gate insulating films separately from the step for forming the gate insulating films.

More specifically, the present disclosure is made with respect to a TFT memory having a drive TFT and a memory TFT, each having, over an insulating substrate, a gate electrode, a semiconductor layer overlapping with the gate electrode across a common gate insulating film having a capability of charge accumulation interposed therebetween, and a source electrode and a drain electrode, spaced apart from each other, coupled to the semiconductor layer, and each also having a channel region in the semiconductor layer between connection regions of the source electrode and of the drain electrode. The present disclosure is made also with respect to a display unit including such a TFT memory. The present disclosure provides solutions described below.

That is, a first aspect of the invention is a TFT memory in which an area C1 of the channel region of the drive TFT and an area C2 of the channel region of the memory TFT are set to have a relationship C1<C2 to an extent that allows predetermined hysteresis natures dependent on respective functions thereof.

According to the above configuration, the area of the interface between the gate insulating film portion and the channel region (semiconductor layer) is relatively small in the drive TFT, thereby causing a smaller amount of charge to be trapped in the gate insulating film portion of the drive TFT, and accordingly the amount of accumulated charge to be smaller. Thus, the hysteresis nature of the drive TFT can be reduced to an acceptable level.

In contrast, since the area of the interface between the gate insulating film portion and the channel region (semiconductor layer) is relatively large in the memory TFT, a larger amount of charge is trapped in the gate insulating film portion of the memory TFT, and accordingly the amount of accumulated charge is larger. Thus, a sufficient hysteresis nature can be ensured for the memory TFT.

As described above, both the drive TFT and the memory TFT can be adjusted to have predetermined hysteresis natures dependent on respective functions thereof by means of the areas of the channel regions without performing a step for adjusting the capability of charge accumulation on the gate insulating films separately from the step for forming the gate insulating films. Thus, the number of steps needed for forming a TFT memory can be reduced. As a result, the TFT memory can be formed at a lower cost.

A second aspect of the invention is the TFT memory of the first aspect of the invention where a channel width of the drive TFT and a channel width of the memory TFT are a same width, or the channel width of the drive TFT is relatively narrow and the channel width of the memory TFT is relatively wide, and letting ΔVh denote a hysteresis width of each of the drive TFT and the memory TFT when the channel widths of the drive TFT and of the memory TFT are constant and a channel length is L, following relationships are satisfied:

$$Ld < \Delta Vhd \cdot L / \Delta Vh$$

and $$Lm > \Delta Vhm \cdot L / \Delta Vh$$

where Ld is a channel length of the drive TFT, Lm is a channel length of the memory TFT, ΔVhd is an acceptable hysteresis width for the drive TFT, and ΔVhm is a hysteresis width required for the memory TFT.

The above configuration ensures that the hysteresis nature of the drive TFT is reduced to an acceptable level, and that the hysteresis nature required for the memory TFT is ensured. This allows the drive TFT to perform correct selective driving, and the memory TFT to provide a good memory function.

A third aspect of the invention is the TFT memory of either the first or second aspect of the invention where a channel length of the drive TFT and a channel length of the memory TFT are a same length, or the channel length of the drive TFT is relatively short and the channel length of the memory TFT is relatively long, and letting ΔVh denote a hysteresis width of each of the drive TFT and the memory TFT when the channel lengths of the drive TFT and the memory TFT are constant and a channel width is W, following relationships are satisfied:

$$Wd < \Delta Vhd \cdot W / \Delta Vh$$

and $$Wm > \Delta Vhm \cdot W / \Delta Vh$$

where Wd is a channel width of the drive TFT, Wm is a channel width of the memory TFT, ΔVhd is an acceptable hysteresis width for the drive TFT, and ΔVhm is a hysteresis width required for the memory TFT.

The above configuration also ensures that the hysteresis nature of the drive TFT is reduced to an acceptable level, and that the hysteresis nature required for the memory TFT is ensured. This allows the drive TFT to perform correct selective driving, and the memory TFT to provide a good memory function.

A fourth aspect of the invention is the TFT memory of one of the first through third aspects of the invention where the semiconductor layer of each of the drive TFT and the memory TFT is formed of indium gallium zinc oxide (hereinafter referred to as In—Ga—Zn—O)-based oxide semiconductor.

The above configuration provides the drive TFT and the memory TFT with, in particular, improved properties including high mobility, high reliability, and low OFF current.

A fifth aspect of the invention is the TFT memory of one of the first through fourth aspects of the invention where the drive TFT and the memory TFT each have a bottom gate structure, in which the gate electrode is covered with the gate insulating film, and the semiconductor layer, the source electrode, and the drain electrode are formed over the gate insulating film.

The above configuration reduces the number of photomasks and the number of steps needed for forming the TFT memory as compared to when the drive TFT or the memory TFT has a top gate structure, thereby allowing the TFT memory to be formed at a lower cost.

A sixth aspect of the invention is a display unit having the TFT memory of one of the first through fifth aspects of the invention.

According to the above configuration, the TFT memory of each of the first through fifth aspects of the invention has improved properties such that both the drive TFT and the memory TFT can be adjusted to have predetermined hysteresis natures dependent on the respective functions thereof, and that the number of steps needed for forming the TFT memory can be reduced. Thus, this display unit can also achieve cost reduction.

Advantages of the Invention

According to the present invention, the area C1 of the channel region of the drive TFT and the area C2 of the channel region of the memory TFT are set to have a relationship C1<C2 to an extent that allows predetermined hysteresis natures dependent on respective functions thereof, and therefore the number of steps needed for forming a TFT memory is reduced, while reducing the hysteresis nature of the drive TFT to an acceptable level, and at the same time, ensuring a sufficient hysteresis nature for the memory TFT. This allows the TFT memory, and thus the display unit, to be produced at a lower cost.

DESCRIPTION OF EMBODIMENTS

Example embodiments of the present invention will be described below in detail based on the drawings. It is understood that the present invention is not limited to the particular embodiments described below.

<<First Embodiment of Invention>>

Figure 1:
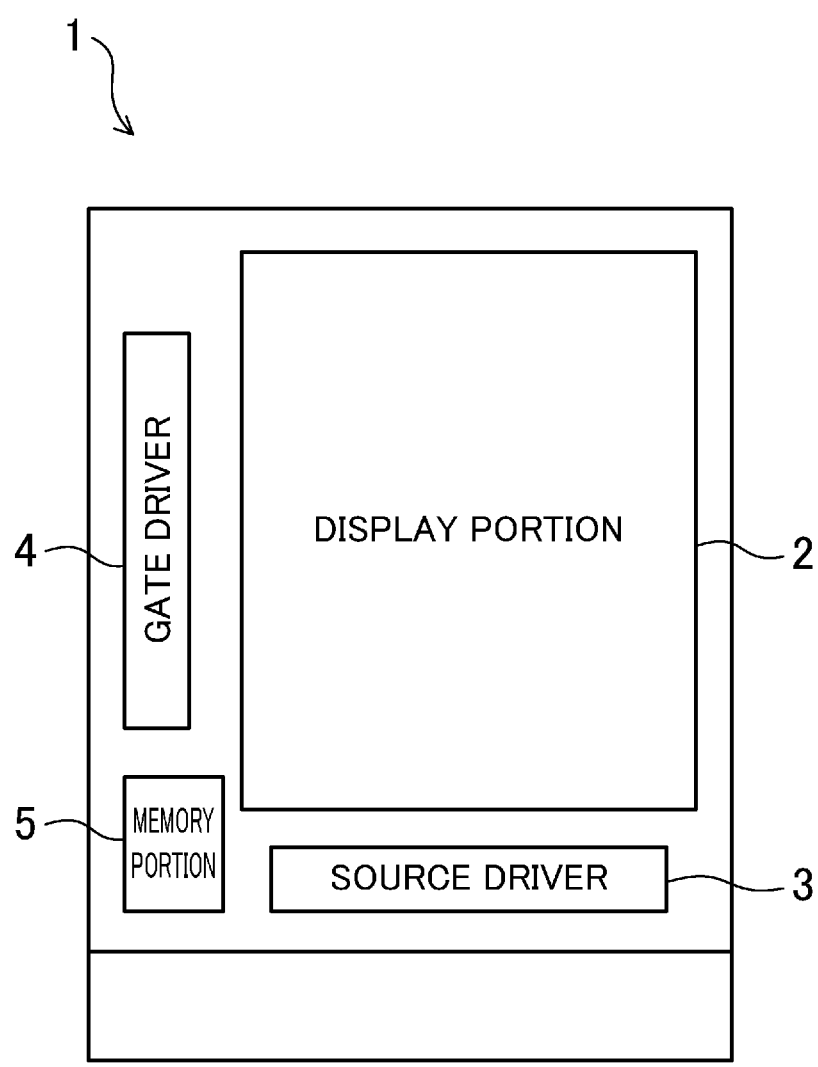
FIG. 1 is a schematic configuration diagram of a liquid crystal display according to the first embodiment.

FIG. 1 is a schematic configuration diagram of a liquid crystal display 1 according to the first embodiment.

A liquid crystal display 1 is used as a display unit, for example, in an electronic book, a personal computer, a mobile phone, a car navigation system, a portable calculator, a touch panel, etc. The liquid crystal display 1 has a configuration in which a liquid crystal layer is confined between a pair of substrates by a seal having a hollow rectangular shape. The liquid crystal display 1 includes a display portion 2, a source driver 3, a gate driver 4, and a non-volatile memory portion 5, and also includes components which are not shown, such as a volatile memory portion, a CPU, a sensor, etc.

Figure 2:
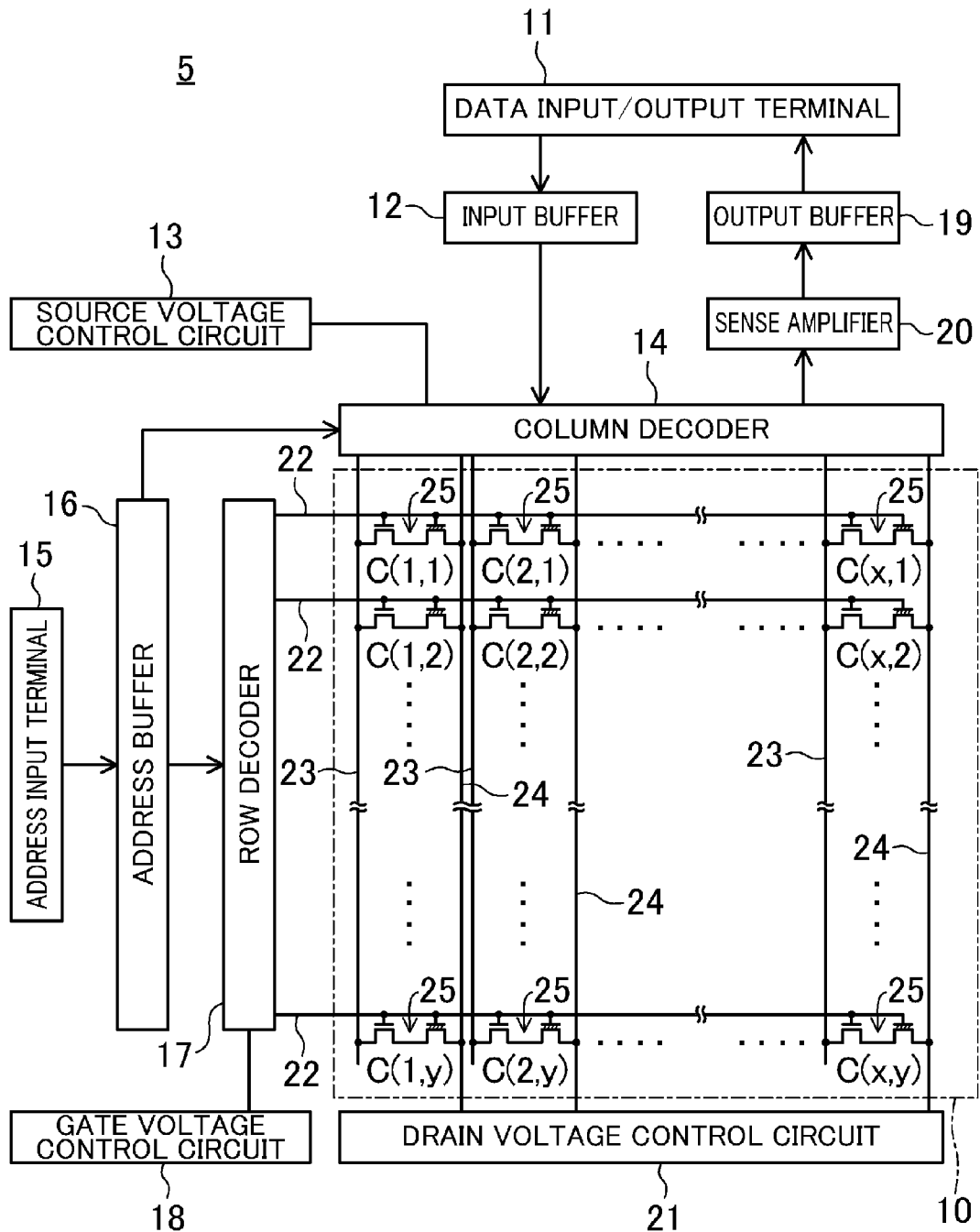
FIG. 2 is a block diagram illustrating an overall schematic configuration of the non-volatile memory portion according to the first embodiment.
Figure 3:
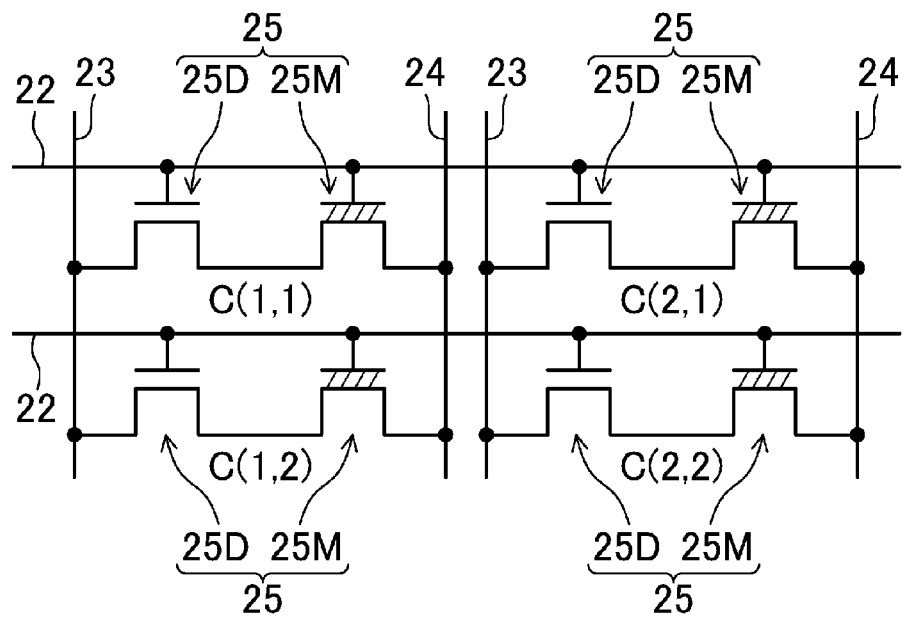
FIG. 3 is an equivalent circuit diagram illustrating a part of the memory cell array.

FIG. 2 is a block diagram illustrating an overall schematic configuration of the non-volatile memory portion 5. FIG. 3 is an equivalent circuit diagram illustrating a part of a memory cell array 10, which will be described later herein.

As shown in FIG. 2, the non-volatile memory portion 5 includes a memory cell array 10, a data input/output terminal 11, an input buffer 12, a source voltage control circuit 13, a column decoder 14, an address input terminal 15, an address buffer 16, a row decoder 17, a gate voltage control circuit 18, an output buffer 19, a sense amplifier 20, a drain voltage control circuit 21, and a control means (not shown) for controlling the control circuits, the buffers, etc.

The memory cell array 10 includes a plurality of gate lines 22 extending in parallel to one another, a plurality of source lines 23 extending in parallel to one another along a direction crossing the gate lines 22, and a plurality of drain lines 24 extending along the source lines 23. The memory cell array 10 is configured such that a plurality of TFT memories 25 are arranged in a matrix format, which respectively form memory cells C(1,1)-C(x,y; x and y are each an integer of a power of two) in which data can be electrically rewritten, in regions respectively delimited by the gate lines 22, the source lines 23, and the drain lines 24

Each of the gate lines 22 is coupled to the row decoder 17. Each of the source lines 23 and the drain lines 24 is coupled to the column decoder 14. Each of the drain lines 24 is also coupled to the drain voltage control circuit 21.

As shown in FIG. 3, each of the TFT memories 25 includes a memory TFT 25M, which stores data, and a drive TFT 25D, which selectively drives the memory TFT 25M.

In TFT memories 25 respectively forming the memory cells C(1,n; n is an integer greater than or equal to one)-C(x,n) in a same row, the gate electrodes of the drive TFTs 25D and of the memory TFTs 25M are coupled to a same gate line 22. In TFT memories 25 respectively forming memory cells C(n, 1)-C(n,y) in a same column, the source electrodes of the drive TFTs 25D are coupled to a same source line 23, and the drain electrodes of the memory TFTs 25M are coupled to a same drain line 24.

The gate voltage control circuit 18 is a drive control circuit which controls the voltages of the respective gate lines 22. The source voltage control circuit 13 is a drive control circuit which controls the voltages of the respective source lines 23. The drain voltage control circuit 21 is a drive control circuit which controls the voltages of the respective drain lines 24.

The address buffer 16 is an address signal distribution circuit, which separates address signals input from the address input terminal 15 into column address signals and row address signals, and distributes and inputs the column address signals and the row address signals to the column decoder 14 and to the row decoder 17, respectively. The column decoder 14 is a column selection circuit, which selects a source line 23 corresponding to the input address. The row decoder 17 is a row selection circuit, which selects a gate line 22 corresponding to the input address.

In the non-volatile memory portion 5, data input through the data input/output terminal 11 is written through the input buffer 12 to the TFT memory 25 which forms the memory cell selected by both the column decoder 14 and the row decoder 17. Alternatively, data written to the TFT memory 25 which forms the memory cell selected by both the column decoder 14 and the row decoder 17 is read through the drain line 24, is amplified in the sense amplifier 20, and then is output through the output buffer 19 to the data input/output terminal 11.

Figure 4:
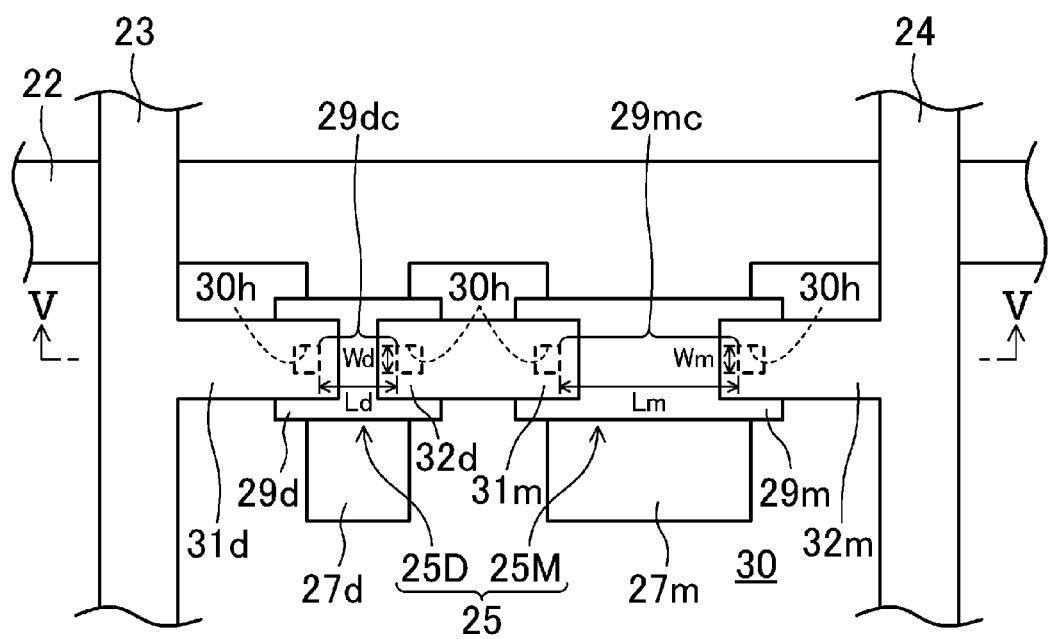
FIG. 4 is a plan view illustrating a configuration of a TFT memory according to the first embodiment.
Figure 5:
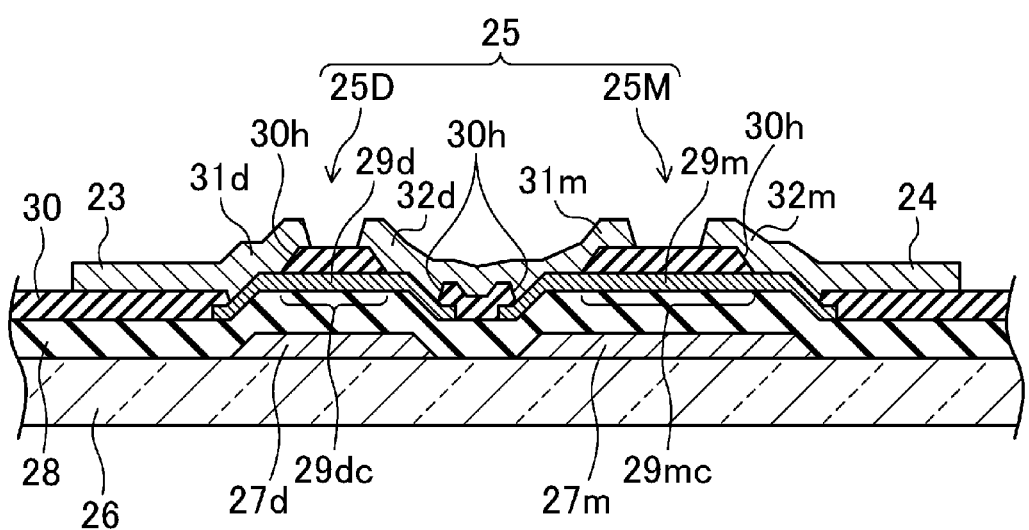
FIG. 5 is a cross-sectional view illustrating a cross-sectional configuration taken along line V-V of FIG. 4.

FIGS. 4 and 5 are schematic configuration diagrams of the TFT memory 25 according to this embodiment. FIG. 4 is a plan view illustrating the TFT memory 25, and FIG. 5 is a cross-sectional view illustrating a cross-sectional configuration taken along line V-V of FIG. 4.

As shown in FIG. 5, the drive TFT 25D and the memory TFT 25M are formed over an insulating substrate 26 such as a glass substrate. The TFTs 25D and 25M each have a bottom gate structure, and include gate electrodes 27d and 27m, respectively, formed on the surface of the insulating substrate 26, a gate insulating film 28 formed so as to cover the gate electrodes 27d and 27m, semiconductor layers 29d and 29m formed on the gate insulating film 28 so as to respectively overlap with the gate electrodes 27d and 27m, source electrodes 31d and 31m and drain electrodes 32d and 32m, spaced apart from each other, coupled to the semiconductor layers 29d and 29m.

The drive TFT 25D and the memory TFT 25M are coupled in series. That is, the drain electrode 32d of the drive TFT 25D and the source electrode 31m of the memory TFT 25M are formed as a monolithic component.

The gate electrodes 27d and 27m of the drive TFT 25D and of the memory TFT 25M are the portions protruding downward of the corresponding gate line 22 in FIG. 4. The source electrode 31d of the drive TFT 25D is the portion protruding rightward of the corresponding source line 23 in FIG. 4. The drain electrode 32m of the memory TFT 25M is the portion protruding leftward of the corresponding drain line 24 in FIG. 4.

The gate insulating film 28 is formed of silicon nitride (SiN) or silicon oxide (SiO) having the capability of charge accumulation, is formed over almost the entire surface of the substrate, and is common to the drive TFT 25D and the memory TFT 25M. The semiconductor layers 29d and 29m are formed of In—Ga—Zn—O-based oxide semiconductor. This allows the drive TFT 25D and the memory TFT 25M to provide improved properties including high mobility, high reliability, and low OFF current.

Although this embodiment assumes that the semiconductor layers 29d and 29m are formed of In—Ga—Zn—O-based oxide semiconductor, the material is not limited thereto. The semiconductor layers 29d and 29m may be formed of other oxide semiconductors, such as indium silicon zinc oxide (In—Si—Zn—O)-based, indium aluminum zinc oxide (In—Al—Zn—O)-based, tin silicon zinc oxide (Sn—Si—Zn—O)-based, tin aluminum zinc oxide (Sn—Al—Zn—O)-based, tin gallium zinc oxide (Sn—Ga—Zn—O)-based, gallium silicon zinc oxide (Ga—Si—Zn—O)-based, gallium aluminum zinc oxide (Ga—Al—Zn—O)-based, indium copper zinc oxide (In—Cu—Zn—O)-based, tin copper zinc oxide (Sn—Cu—Zn—O)-based, zinc oxide (Zn—O)-based, and indium oxide (In—O)-based oxide semiconductors, etc. Otherwise, the semiconductor layers 29d and 29m may also be formed of amorphous silicon (a-Si), polysilicon (poly-Si), etc.

In addition, as shown in FIG. 5, an etching stopper film 30, which is an insulating film having contact holes 30h, is formed in the drive TFT 25D and in the memory TFT 25M so as to cover the region other than the connection regions of the source electrodes 31d and 31m and of the drain electrodes 32d and 32m, spaced apart from each other in the semiconductor layers 29d and 29m.

The source electrodes 31d and 31m and the drain electrodes 32d and 32m are formed on the etching stopper film 30, and are respectively coupled to the semiconductor layers 29d and 29m through the respective contact holes 30h. Channel regions 29dc and 29mc are formed between the connection regions of the source electrodes 31d and 31m and of the drain electrodes 32d and 32m in the semiconductor layers 29d and 29m.

The area C1 of the channel region 29dc of the drive TFT 25D and the area C2 of the channel region 29mc of the memory TFT 25M are set to have a relationship C1<C2 to an extent that allows predetermined hysteresis natures dependent on respective functions thereof.

That is, in the drive TFT 25D, the area C1 of the channel region 29dc is relatively small, and therefore the area of the interface between the channel region 29dc and the gate insulating film portion is relatively small. Then, a smaller amount of charge is trapped in the gate insulating film portion accordingly, thereby causing the amount of accumulated charge to be smaller. Thus, the hysteresis nature of the drive TFT 25D can be reduced to an acceptable level. In contrast, in the memory TFT 25M, the area C2 of the channel region 29mc is relatively large, and therefore the area of the interface between the channel region 29mc and the gate insulating film portion is relatively large. Then, a larger amount of charge is trapped in the gate insulating film portion accordingly, thereby causing the amount of accumulated charge to be larger. Thus, a sufficient hysteresis nature can be ensured for the memory TFT 25M.

Specifically in this embodiment, the channel widths of the drive TFT 25D and of the memory TFT 25M are a same width; and the channel length of the drive TFT 25D is relatively short, and the channel length of the memory TFT 25M is relatively long. Regarding the drive TFT 25D and the memory TFT 25M, as shown in FIG. 4, expressing the channel length of the drive TFT 25D by Ld, the channel width thereof by Wd, the channel length of the memory TFT 25M by Lm, and the channel width thereof by Wm, the channel lengths Ld and Lm which determine the sizes of the channel regions 29dc and 29mc of the drive TFT 25D and of the memory TFT 25M are determined as follows.

That is, letting $\Delta Vh$ denote the hysteresis width of each of the TFTs 25D and 25M when the channel widths of the drive TFT 25D and of the memory TFT 25M are constant and a channel length is L, a proportional relationship between the channel length L and the hysteresis width $\Delta Vh$ allows Eq. 1 below to be satisfied.

$$\Delta Vh = \alpha \cdot L \text{ (where } \alpha \text{ is a proportionality constant)} \quad \text{(Eq. 1)}$$

In addition, letting $\Delta Vhd$ denote an acceptable hysteresis width for the drive TFT 25D and $\Delta Vhm$ denote a hysteresis width which is required for the memory TFT 25M, equations for determining the channel lengths Ld and Lm of the drive TFT 25D and of the memory TFT 25M can be written as Eqs. 2 and 3 below.

$$Ld < \Delta Vhd/\alpha \quad \text{(Eq. 2)}$$

and $$Lm > \Delta Vhm/\Delta \quad \text{(Eq. 3)}$$

Eq. 1 and Eqs. 2 and 3 above yield Eqs. 4 and 5 below, respectively.

$$Ld < \Delta Vhd \cdot L/\Delta Vh \quad \text{(Eq. 4)}$$

and $$Lm > \Delta Vhm \cdot L/\Delta Vh \quad \text{(Eq. 5)}$$

Here, since the value of $L/\Delta Vh$ (i.e., $\alpha$) is known, determination of the values of $\Delta Vhd$ and $\Delta Vhm$ allows the values of the channel lengths Ld and Lm of the drive TFT 25D and of the memory TFT 25M to be respectively determined from Eqs. 4 and 5 above. Thus, the hysteresis nature of the drive TFT 25D can be reduced to an acceptable level, and at the same time, a sufficient hysteresis nature can be ensured for the memory TFT 25M. This allows the drive TFT 25D to perform correct selective driving, and the memory TFT 25M to provide a good memory function.

—Method of Driving Memory Cell Array 10—

Figure 6:
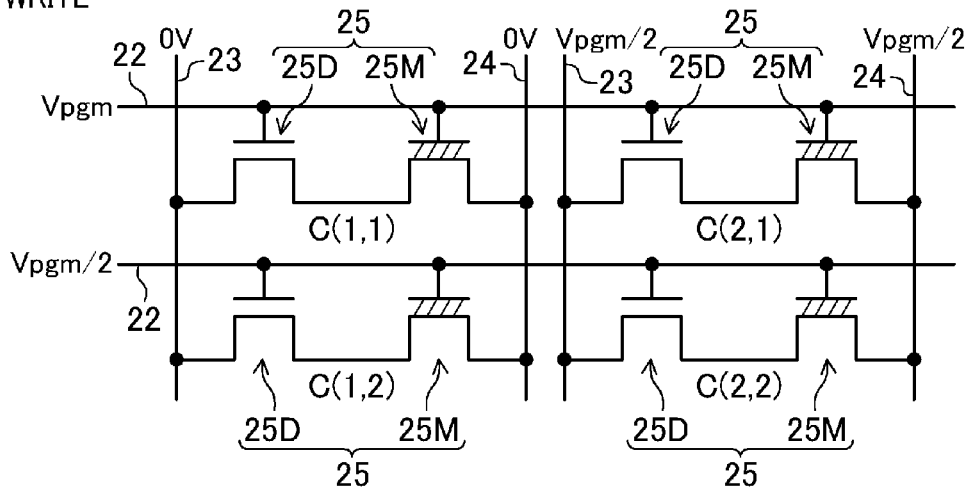
FIG. 6 is an equivalent circuit diagram illustrating a part of the memory cell array for explaining methods of (a) writing, (b) erasing, and (c) reading of the TFT memory.
Figure 6:
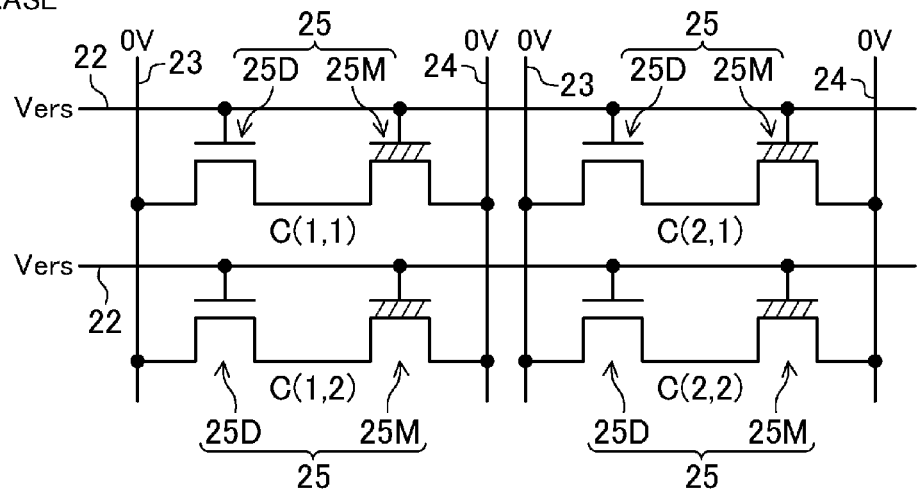
Figure 6:
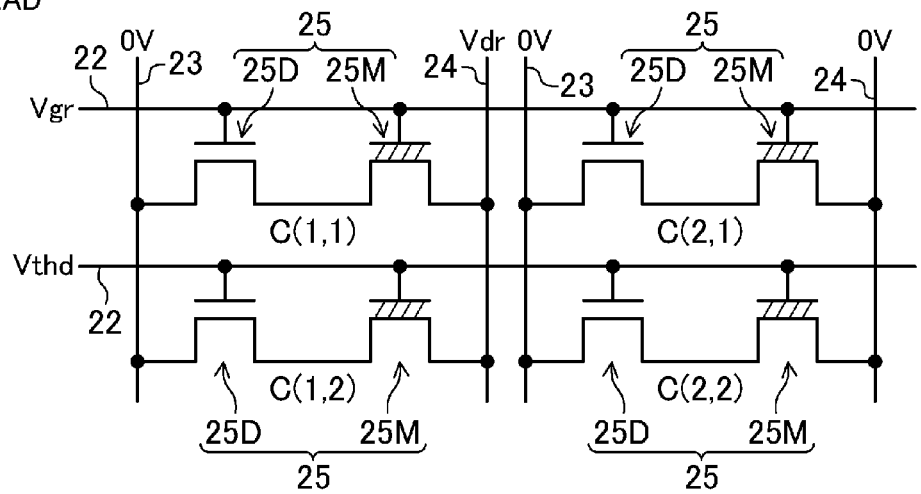

Next, a method of driving the memory cell array 10 to perform a write, an erase, and a read operations of the TFT memory 25 described above will be described using an example with reference to FIG. 6. FIG. 6 is an equivalent circuit diagram illustrating a part of the memory cell array 10, and illustrates voltage application conditions when data is written into the TFT memory 25 in Part (a), when data is erased from the TFT memory 25 in Part (b), and when data is read from the TFT memory 25 in Part (c).

<Data Write>

Data is written into the TFT memory 25 by applying a positive voltage between the gate electrode 27d and the source electrode 31*d* of the drive TFT 25D, and between the gate electrode 27*m* and the drain electrode 32*m* of the memory TFT 25M.

More specifically, if the memory cell C(1,1), for example, is selected as a write target, then as shown in Part (a) of FIG. 6, a write voltage Vpgm (e.g., +30 V) is applied to the gate line 22 corresponding to the write target memory cell C(1,1), and 0 V is applied to the source line 23 and to the drain line 24 corresponding to the memory cell C(1,1).

In contrast, a voltage Vpgm/2 (e.g., +15 V) which is one half of the write voltage Vpgm is applied to the gate lines 22 corresponding to the non-data write target memory cells C(1,2)-C(m,n; 1≤m≤x, 2≤n≤y) which are located in different rows from the write target memory cell C(1,1). The voltage Vpgm/2 (e.g., +15 V) is also applied to the source lines 23 and the drain lines 24 corresponding to the non-data write target memory cells C(2,1)-(p,q; 2≤p≤x, 1≤q≤y) which are located in different columns from the write target memory cell C(1,1).

Application of these voltage signals causes, in the data write target memory cell C(1,1), a potential difference equivalent to the write voltage Vpgm is developed between the gate electrodes 27*d* and 27*m*, and the source electrodes 31*d* and 31*m* and the drain electrodes 32*d* and 32*m* of the drive TFT 25D and of the memory TFT 25M in the TFT memory 25. This turns on both the drive TFT 25D and the memory TFT 25M, thereby changing the memory TFT 25M to the written state. In order to prevent erroneous write operations from being performed on non-data write target memory cells described below, the time duration of this written state is, for example, within one second.

The non-write target memory cells C(2,1)-C(p,1; 2≤p≤x) located in the same row as the write target memory cell C(1,1) each have the potential difference which is one half of the write voltage Vpgm, between the gate electrodes 27*d* and 27*m*, and the source electrodes 31*d* and 31*m* and the drain electrodes 32*d* and 32*m* of the drive TFT 25D and of the memory TFT 25M in the TFT memory 25, and therefore each of such memory TFTs 25M is in a write prevention state.

In addition, the write target memory cells C(1,2)-C(m,n; 1≤m≤x, 2≤n≤y) located in different rows from the write target memory cell C(1,1) also each have the potential difference which is one half of the write voltage Vpgm, between the gate electrodes 27*d* and 27*m*, and the source electrodes 31*d* and 31*m* and the drain electrodes 32*d* and 32*m* of the drive TFT 25D and of the memory TFT 25M in the TFT memory 25, and therefore each of such memory TFTs 25M is in a write prevention state.

The data write operation to the TFT memory 25 described above is performed by appropriately selecting write target memory cells from the memory cells C(1,1)-C(x,y), thereby allowing the memory cell array 10 to store data whose amount is dependent on the number of memory cells.

<Data Erase>

Data is erased from the TFT memory 25 by applying a negative voltage between the gate electrode 27*d* and the source electrode 31*d* of the drive TFT 25D, and between the gate electrode 27*m* and the drain electrode 32*m* of the memory TFT 25M.

More specifically, as shown in Part (b) of FIG. 6, a negative voltage Vers (e.g., −30 V) is applied to all the gate lines 22, and 0 V is applied to all the source lines 23 and the drain lines 24. Application of the voltage signals as described above causes the data stored in the TFT memories 25 of all the memory cells C(1,1)-C(x,y) to be erased at one time.

<Data Read>

Data is read from the TFT memory 25 by applying a positive voltage between the gate electrode 27*d* and the source electrode 31*d* of the drive TFT 25D, and 0 V between the gate electrode 27*m* and the drain electrode 32*m* of the memory TFT 25M.

More specifically, if the memory cell C(1,1), for example, is selected as a read target, then as shown in Part (c) of FIG. 6, a data read voltage Vgr (e.g., +5 V) is applied to the gate line 22 corresponding to the read target memory cell C(1,1), 0 V is applied to the source line corresponding to the memory cell C(1,1), and a data read voltage Vdr (e.g., +5 V) is applied to the drain line 24 corresponding to the memory cell C(1,1).

In contrast, a voltage Vthd (e.g., −5 V) at or below the threshold of the drive TFT 25D of each of the non-read target memory cells C(1,2)-C(m,n; 1≤m≤x, 2≤n≤y) which are located in different rows from the read target memory cell C(1,1) is applied to the gate lines 22 corresponding to the memory cells C(1,2)-C(m,n). At the same time, 0 V is applied to the source lines 23 and the drain lines 24 corresponding to the non-data read target memory cells C(2,1)-C(p,q; 2≤p≤x, 1≤q≤y) which are located in different columns from the data read target memory cell C(1,1).

Application of these voltage signals causes a current having a magnitude dependent on the data stored in the memory TFT 25M of the TFT memory 25 which forms the read target memory cell C(1,1) to flow from that memory TFT 25M to the drain lines 24. That is, if data has been written into the memory TFT 25M, a charge has been trapped in the vicinity of the interface with the semiconductor layer 29*m* in the gate insulating film portion of that memory TFT 25M, and therefore the threshold voltage of the memory TFT 25M is increased as compared to that of an initial state (no charge is trapped in the gate insulating film portion), thereby causing the amount of current which flows through the memory TFT 25M to change. By detecting this amount of current through the drain line 24, it can be determined whether data has or has not been written into the memory TFT 25M.

The data read operation from the TFT memory 25 described above is performed by appropriately selecting read target memory cells from the memory cells C(1,1)-C(x,y), thereby allowing data to be read from the memory cell array 10.

—Method of Forming Memory Cell Array 10—

Figure 7:
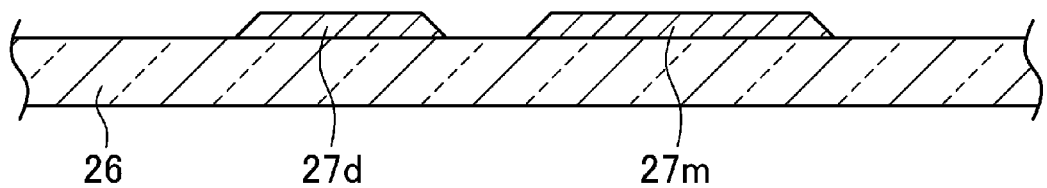
FIG. 7 is a process flow diagram illustrating a method of forming the memory cell array.
Figure 7:
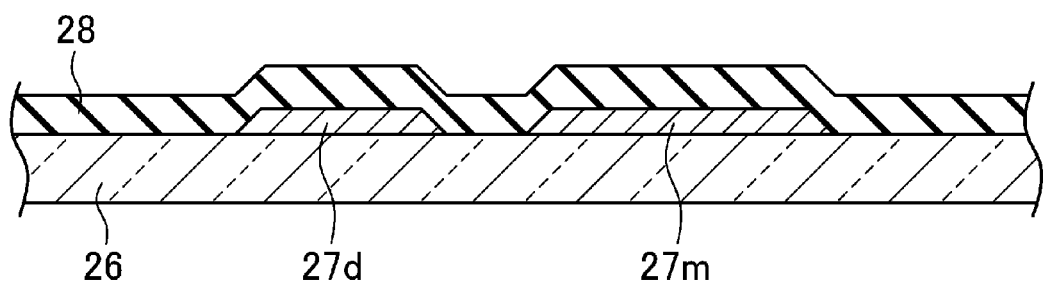
Figure 7:
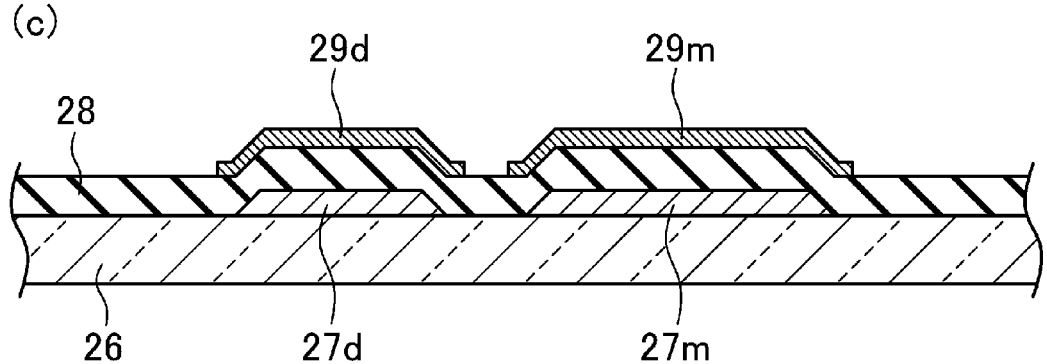
Figure 7:
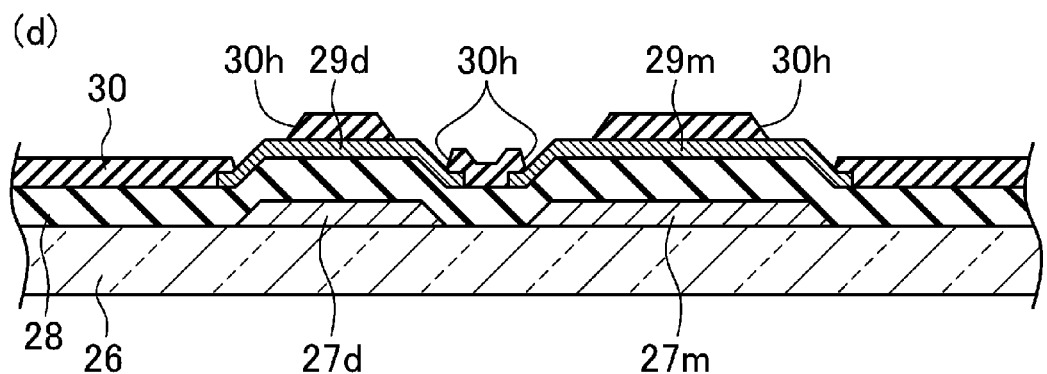

Next, a method of forming the memory cell array 10 will be described using an example with reference to FIG. 7. FIG. 7 is a process flow diagram illustrating a method of forming the memory cell array 10, and illustrates regions corresponding to those of FIG. 5.

The method of forming the memory cell array 10 includes a step of forming gate electrodes, a step of forming a gate insulating film, a step of forming semiconductor layers, a step of forming an etching stopper film, and a step of forming source and drain electrodes.

<Step of Forming Gate Electrodes>

A metal film (e.g., approximately 100 nm to 300 nm thick) of metal such as molybdenum (Mo), titanium (Ti), aluminum (Al), tantalum (Ta), or chromium (Cr) is formed using a sputtering technique over the insulating substrate 26, such as a glass substrate, prepared in advance. Subsequently, this metal film is patterned by using photolithography using a first photomask, thereby forming the gate line 22 and the gate electrodes 27*d* and 27*m* as shown in Part (a) of FIG. 7.

<Step of Forming Gate Insulating Film>

A silicon oxide film or silicon nitride film (e.g., approximately 300 nm to 400 nm thick) is formed over the substrate on which the gate electrodes 27*d* and 27*m* have been formed, using a plasma chemical vapor deposition (CVD) technique at a temperature of, for example, about 300° C. to 400° C., thereby forming the gate insulating film 28 having the capability of charge accumulation as shown in Part (b) of FIG. 7.

<Step of Forming Semiconductor Layers>

An In—Ga—Zn—O-based oxide semiconductor film (e.g., approximately 40 nm to 50 nm thick) is formed over the substrate on which the gate insulating film 28 has been formed, using a sputtering technique at a temperature of, for example, about 200° C. to 400° C. Subsequently, this oxide semiconductor film is patterned by using photolithography using a second photomask, thereby forming the semiconductor layers 29*d* and 29*m* as shown in Part (c) of FIG. 7.

<Step of Forming Etching Stopper Film>

An etching stopper film 30 (e.g., approximately 100 nm to 200 nm thick) is formed over the substrate on which the semiconductor layers 29*d* and 29*m* have been formed, using a plasma CVD technique at a temperature of, for example, about 300° C. to 400° C. Subsequently, this etching stopper film 30 is patterned by using photolithography using a third photomask, thereby forming contact holes 30*h* in the etching stopper film 30 as shown in Part (d) of FIG. 7.

<Step of Forming Source and Drain Electrodes>

A metal film (e.g., approximately 100 nm to 300 nm thick) of, for example, molybdenum (Mo), titanium (Ti), aluminum (Al), tantalum (Ta), chromium (Cr), etc. is formed using a sputtering technique over the substrate on which the etching stopper film 30 has been formed. Subsequently, this metal film is patterned by using photolithography using a fourth photomask, thereby forming the source line 23, the drain line 24, the source electrodes 31*d* and 31*m*, and the drain electrodes 32*d* and 32*m*, and further the drive TFT 25D and the memory TFT 25M having these elements. Thus, the TFT memory 25 is formed.

Then, a heat treatment is performed on the substrate on which the source electrodes 31*d* and 31*m* and the drain electrodes 32*d* and 32*m* have been formed, at a temperature of, for example, about 200° C. to 400° C. in a dry atmosphere for one to two hours.

The steps described above can form the memory cell array 10. Here, since the drive TFT 25D and the memory TFT 25M each have a bottom gate structure, the number of photomasks and the number of steps needed for forming the TFT memory 25 are reduced as compared to when the drive TFT or the memory TFT has a top gate structure, thereby allowing the memory cell array 10 to be formed at a lower cost.

—Advantages of First Embodiment—

Thus, according to this first embodiment, both the drive TFT 25D and the memory TFT 25M can be adjusted to have predetermined hysteresis natures dependent on the respective functions thereof based on the areas of the channel regions 29*dc* and 29*mc* without performing, on the gate insulating film 28, a step for adjusting the capability of charge accumulation separately from the step for forming the gate insulating film 28, thereby allowing the number of steps needed for forming the TFT memory 25 to be reduced. As a result, the memory cell array 10 formed of a plurality of the TFT memories 25 can be produced at a lower cost, and accordingly the liquid crystal display 1 including the memory cell array 10 can also be fabricated at a lower cost.

<<Second Embodiment of Invention>>

Figure 8:
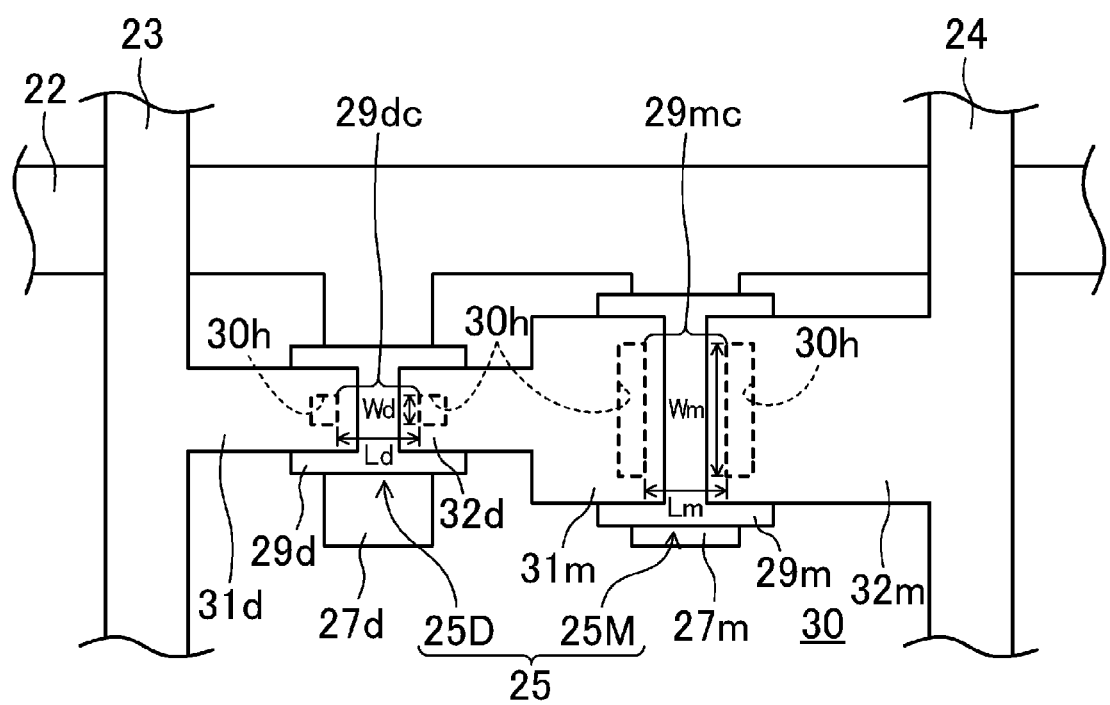
FIG. 8 is a plan view illustrating a configuration of a TFT memory according to the second embodiment.

FIG. 8 is a plan view illustrating a configuration of a TFT memory 25 according to the second embodiment. In this second embodiment, the liquid crystal display 1 is configured similarly to that of the first embodiment described above except that the configuration of each of the TFT memories 25 included in the memory cell array 10 differs from that of the first embodiment. Accordingly, only the TFT memory 25 having the different configuration will be described below. The description of the first embodiment based on FIGS. 1-7 also applies to the same components as those of the first embodiment, and the detailed explanation thereof will be omitted.

Also in this embodiment, the area C1 of the channel region 29*dc* of the drive TFT 25D and the area C2 of the channel region 29*mc* of the memory TFT 25M are set to have a relationship C1<C2 to an extent that allows predetermined hysteresis natures dependent on respective functions thereof.

In the first embodiment described above, the channel widths Wd and Wm of the drive TFT 25D and of the memory TFT 25M are a same width; and the channel length Ld of the drive TFT 25D is relatively short, and the channel length Lm of the memory TFT 25M is relatively long. However, in this embodiment, the channel lengths Ld and Lm of the drive TFT 25D and of the memory TFT 25M are a same length; and the channel width Wd of the drive TFT 25D is relatively narrow, and the channel width Wm of the memory TFT 25M is relatively wide.

The channel widths Wd and Wm, which determine the sizes of the channel regions 29*dc* and 29*mc* of the drive TFT 25D and of the memory TFT 25M, can be respectively determined from equations derived in a similar manner to Eqs. 4 and 5 above, which respectively determine the channel widths Wd and Wm of the drive TFT 25D and of the memory TFT 25M in the first embodiment described above.

That is, letting ΔVh denote the hysteresis width of each of the TFTs 25D and 25M when the channel lengths of the drive TFT 25D and of the memory TFT 25M are constant and a channel width is W, a proportional relationship between the channel width W and the hysteresis width ΔVh allows Eq. 6 below to be satisfied.

$$\Delta Vh = \beta \cdot W \text{ (where } \beta \text{ is a proportionality constant)} \quad \text{(Eq. 6)}$$

In addition, equations for determining the channel widths Wd and Wm of the drive TFT 25D and of the memory TFT 25M can be written as Eqs. 7 and 8 below.

$$Wd < \Delta Vhd/\beta \quad \text{(Eq. 7)}$$

$$Wm > \Delta Vhm/\beta \quad \text{(Eq. 8)}$$

Eq. 6 and Eqs. 7 and 8 above yield Eqs. 9 and 10 below, respectively.

$$Wd < \Delta Vhd \cdot W/\Delta Vh \quad \text{(Eq. 9)}$$

$$Wm > \Delta Vhm \cdot W/\Delta Vh \quad \text{(Eq. 10)}$$

Here, since the value of W/ΔVh (i.e., β) is known, determination of the values of ΔVhd and ΔVhm allows the values of the channel widths Wd and Wm of the drive TFT 25D and of the memory TFT 25M to be respectively determined from Eqs. 9 and 10 above. Thus, it is ensured that the hysteresis nature of the drive TFT 25D can be reduced to an acceptable level, and at the same time, the hysteresis nature required for the memory TFT 25M is ensured. This allows the drive TFT 25D to perform correct selective driving, and the memory TFT 25M to provide a good memory function.

—Advantages of Second Embodiment—

Thus, according to this second embodiment also, both the drive TFT 25D and the memory TFT 25M can be adjusted to have predetermined hysteresis natures dependent on the respective functions thereof based on the areas of the channel regions 29*dc* and 29*mc* without performing, on the gate insulating film 28, a step for adjusting the capability of charge accumulation separately from the step for forming the gate insulating film 28, thereby allowing the number of steps needed for forming the TFT memory 25 to be reduced. As a result, the second embodiment provides similar advantages to the first embodiment.

Moreover, since the sizes of the channel regions 29dc and 29mc of the drive TFT 25D and of the memory TFT 25M are adjusted by the channel widths Wd and Wm, the amount of current which flows into the memory TFT 25M during a data read operation is higher as compared to when the sizes of the channel regions 29dc and 29mc of the respective TFTs 25D and 25M are adjusted by the channel lengths Ld and Lm. Therefore, it can readily be determined whether data has or has not been written into the memory TFT 25M.

<<Other Embodiments>>

In the first embodiment described above, the sizes of the channel regions 29dc and 29mc of the drive TFT 25D and of the memory TFT 25M are adjusted by the channel lengths Ld and Lm based on Eqs. 4 and 5 above while the channel widths Wd and Wm remain the same. In the second embodiment described above, the sizes of the channel regions 29dc and 29mc of the drive TFT 25D and of the memory TFT 25M are adjusted by the channel widths Wd and Wm based on Eqs. 9 and 10 above while the channel lengths Ld and Lm remain the same. However, the present disclosure is not limited thereto.

For example, it is preferable that the channel regions 29dc and 29mc of the drive TFT 25D and of the memory TFT 25M have the channel lengths Ld and Lm respectively having lengths based on Eqs. 4 and 5 of the first embodiment, and the channel widths Wd and Wm respectively having widths based on Eqs. 9 and 10 of the second embodiment.

Such a configuration allows the hysteresis nature of the drive TFT 25D to be reduced, and at the same time, the hysteresis nature of the memory TFT 25M to be increased more than the first and second embodiments. Thus, even if the hysteresis natures of the drive TFT 25D and of the memory TFT 25M vary to some degree among TFT memories 25, the drive TFT 25D is allowed to perform correct selective driving, and the memory TFT 25M is allowed to provide a good memory function. Furthermore, the yield rate increases.

Although the first embodiment assumes that the channel widths Wd and Wm of the drive TFT 25D and of the memory TFT 25M are the same, the configuration is not limited thereto, but the channel width Wd of the drive TFT 25D may be relatively narrow, and the channel width Wm of the memory TFT 25M may be relatively wide.

In addition, although the second embodiment assumes that the channel lengths Ld and Lm of the drive TFT 25D and of the memory TFT 25M are the same, the configuration is not limited thereto, but the channel length Ld of the drive TFT 25D may be relatively short, and the channel length Lm of the memory TFT 25M may be relatively long.

Or otherwise, the sizes of the channel regions 29dc and 29mc of the drive TFT 25D and of the memory TFT 25M do not necessarily need to be the channel lengths Ld and Lm and the channel widths Wd and Wm respectively based on Eqs. 4, 5, 9, and 10, but it is sufficient that the area of the channel region 29dc of the drive TFT 25D is relatively small, and that the area of the channel region 29mc of the memory TFT 25M is relatively large so that the drive TFT 25D and the memory TFT 25M have predetermined hysteresis natures dependent on the respective functions thereof.

The preferred embodiments of the invention have been described. However, the technical scope of the invention are not limited to those described in these embodiments. These embodiments are illustrated by way of example only, and it will be appreciated by those skilled in the art that various variations are also possible in combinations of the components and/or processing processes of these embodiments, and that such variations also fall within the scope of the invention.

For example, although the first and second embodiments have each been described using the example in which the drive TFT 25D and the memory TFT 25M each have a bottom gate structure, the present disclosure is not limited thereto. The drive TFT 25D and the memory TFT 25M may each have a top gate structure, in which the positional relationships between the gate electrodes 27d and 27m and the semiconductor layers 29d and 29m interposing the gate insulating film 28 are reversed. For example, the drive TFT 25D and the memory TFT 25M may each employ a configuration such that semiconductor layers are formed on the insulating substrate, gate electrodes are formed on the semiconductor layers across a gate insulating film interposed therebetween, a source electrode and a drain electrode are formed, spaced apart from each other, on an interlayer insulating film which covers the gate electrodes, and the source electrode and the drain electrode are respectively coupled to the semiconductor layers through contact holes formed in the interlayer insulating film and in the gate insulating film.

Moreover, although the first and second embodiments have each been described with respect to the liquid crystal display 1 by way of example, the present disclosure is not limited thereto. The present invention can be applied not only to the liquid crystal display 1, but also widely to other various display units such as organic electroluminescence (EL) display units, plasma display units, etc., and also to other electronic devices which require a memory function.

INDUSTRIAL APPLICABILITY

As described above, the present invention is useful for TFT memories and display units including the same, and is particularly suitable for TFT memories required to reduce the number of steps needed for forming the TFT memories, while ensuring a sufficient hysteresis nature for the memory TFTs, and at the same time, reducing the hysteresis nature of the drive TFTs to an acceptable level.

DESCRIPTION OF REFERENCE CHARACTERS

1 Liquid Crystal Display
25 TFT Memory
25D Drive TFT
25M Memory TFT
26 Insulating Substrate
27d, 27m Gate Electrode
28 Gate Insulating Film
29d, 29m Semiconductor Layer
29dc, 29mc Channel Region
31d, 31m Source Electrode
32d, 32m Drain Electrode

The invention claimed is:

1. A thin film transistor (hereinafter referred to as TFT) memory having a drive TFT and a memory TFT, each having, over an insulating substrate, a gate electrode, a semiconductor layer overlapping with the gate electrode across a common gate insulating film having a capability of charge accumulation interposed therebetween, and a source electrode and a drain electrode, spaced apart from each other, coupled to the semiconductor layer, and each also having a channel region in the semiconductor layer between a position of the semiconductor layer connected to the source electrode and a position of the semiconductor layer connected to the drain electrode, wherein a distance from the position of the semiconductor layer connected to the source electrode to the position of the semiconductor layer connected to the drain electrode is a channel length, and a width between the positions of the semiconductor layer in a direction orthogonal to a direction of the channel length is a channel width, and an area $C1$ of the channel region of the drive TFT and an area $C2$ of the channel region of the memory TFT are set to have a relationship $C1<C2$ to an extent that allows predetermined hysteresis natures dependent on respective functions thereof, the area $C1$ being determined by a channel length and a channel width of the drive TFT, and the area $C2$ being determined by a channel length and a channel width of the memory TFT.

2. The TFT memory of claim 1, wherein the semiconductor layer of each of the drive TFT and the memory TFT is formed of indium gallium zinc oxide-based oxide semiconductor.

3. The TFT memory of claim 1, wherein
the drive TFT and the memory TFT each have a bottom gate structure, in which the gate electrode is covered with the gate insulating film, and the semiconductor layer, the source electrode and the drain electrode are formed over the gate insulating film.

4. A display unit, comprising:
the TFT memory of claim 1.

* * * * *